US010715182B2

(12) United States Patent
Chen et al.

(10) Patent No.: US 10,715,182 B2
(45) Date of Patent: Jul. 14, 2020

(54) SYSTEMS AND METHODS FOR DECODING ERROR CORRECTING CODES WITH SELF-GENERATED LLR

(71) Applicant: Innogrit Technologies Co., Ltd., Shanghai OT (CN)

(72) Inventors: Jie Chen, Milpitas, CA (US); Chung-Li Wang, Fremont, CA (US); Zining Wu, Los Altos, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 0 days.

(21) Appl. No.: 16/047,329

(22) Filed: Jul. 27, 2018

(65) Prior Publication Data
US 2020/0036395 A1  Jan. 30, 2020

(51) Int. Cl.
*H03M 13/45* (2006.01)
*H03M 13/37* (2006.01)
*H03M 13/00* (2006.01)
*H03M 13/11* (2006.01)

(52) U.S. Cl.
CPC ....... *H03M 13/45* (2013.01); *H03M 13/1108* (2013.01); *H03M 13/3746* (2013.01); *H03M 13/616* (2013.01)

(58) Field of Classification Search
CPC ............. H03M 13/45; H03M 13/3746; H03M 13/616; H03M 13/1108
USPC ........................................................ 714/755
See application file for complete search history.

(56) References Cited

U.S. PATENT DOCUMENTS

| 8,407,563 | B2* | 3/2013 | Karabed | G11B 20/18 714/769 |
| 10,303,364 | B2* | 5/2019 | Bhatia | H03M 13/152 |
| 10,491,244 | B2* | 11/2019 | Chang | H03M 13/658 |
| 2007/0186138 | A1* | 8/2007 | Yang | H03M 13/1197 714/755 |
| 2008/0244359 | A1* | 10/2008 | Li | H03M 13/1102 714/758 |
| 2010/0058149 | A1* | 3/2010 | Lunglmayr | H03M 13/1105 714/780 |
| 2010/0169746 | A1* | 7/2010 | Karabed | G11B 20/18 714/780 |
| 2010/0174954 | A1* | 7/2010 | Karabed | G11B 20/1833 714/704 |
| 2015/0263760 | A1* | 9/2015 | Hof | H03M 13/3707 714/758 |
| 2016/0350179 | A1* | 12/2016 | Lin | G11C 29/52 |

(Continued)

OTHER PUBLICATIONS

Le et al., On the Use of Hard-Decision LDPC Decoders on MLC NAND Flash Memory, Mar. 1, 2018, IEEE, pp. 1453-1458. (Year: 2018 ).*

(Continued)

*Primary Examiner* — John J Tabone, Jr.
(74) *Attorney, Agent, or Firm* — IPro, PLLC; Xiaomin Huang (57) ABSTRACT

Systems and methods are provided for decoding a codeword encoded by a linear block code. A method may comprise performing a hard decision decoding on a codeword, recording a number of flip(s) for each bit of the codeword, generating reliability information for each bit based on the number of flip(s) for each bit respectively, determining to switch to soft decision decoding according to a switching rule and performing a soft decision decoding on the codeword using the reliability information for each bit.

20 Claims, 6 Drawing Sheets

(56) References Cited

U.S. PATENT DOCUMENTS

| | | | |
|---|---|---|---|
| 2017/0068593 A1* | 3/2017 | Yoshinaga | G06F 11/1068 |
| 2017/0093439 A1* | 3/2017 | Motwani | H03M 13/45 |
| 2017/0279467 A1* | 9/2017 | Bhatia | H03M 13/152 |
| 2017/0288699 A1* | 10/2017 | Yang | H03M 13/45 |
| 2018/0006667 A1* | 1/2018 | Motwani | H03M 13/2909 |
| 2019/0087265 A1* | 3/2019 | Kifune | G06F 11/1012 |
| 2019/0103885 A1* | 4/2019 | Chang | H03M 13/3746 |
| 2019/0149168 A1* | 5/2019 | Chang | H03M 13/1111 714/752 |
| 2019/0149169 A1* | 5/2019 | Chang | H03M 13/658 714/752 |

OTHER PUBLICATIONS

Masunda, Threshold based multi-bit flipping decoding of binary LDPC codes, Aug. 2017, University of the Witwatersrand, Johannesburg, South Africa, pp. 1-139. (Year: 2017).*

Spinner et al., Soft input decoder for high-rate generalised concatenated codes, Jan. 26, 2018, IET Circuits Devices Syst., 2018, vol. 12 Iss. 4, pp. 432-438. (Year: 2018).*

\* cited by examiner

SYSTEMS AND METHODS FOR DECODING ERROR CORRECTING CODES WITH SELF-GENERATED LLR

TECHNICAL FIELD

The disclosure herein relates to decoding codewords encoded with parity check data, particularly relates to decoding codewords using LLR generated from hard decision decoding.

BACKGROUND

One issue common to many data communication or storage systems is the corruption of data, for example, by noise in a communication channel or write/read processes in a storage system. One technique to remedy the data corruption is to use an error-correcting code (ECC) or forward error correction (FEC) code. Both ECC and FEC add redundant data or parity data to user data such that user data can be recovered by a receiver or reader even when a number of errors (up to the capability of the code being used) were introduced, for example, during the process of transmission or corruption on a storage.

A lot of different coding schemes have been developed over the years, for example, Hamming codes, Reed-Solomon codes, Turbo codes, etc. More recently, low density parity check (LDPC) codes have become widely used. All these codes, however, are computation complex and the techniques for using these codes are still in need of improvements.

SUMMARY

Disclosed herein includes a decoder of ECC codewords that may generate reliability information for each code symbol (also may be referred to as a bit in a binary implementation) in a codeword and use the generated reliability information to achieve a better decoding performance. Exemplary ECC decoders according to the present disclosure may operate in two modes: hard decision and soft decision. In one embodiment, a soft data generator may use hard decision information to generate reliability information of each hard decision information bit during a decoding process. The generated reliability information, which for example may be a log-likelihood ratio, may be stored in a soft data buffer. A first switching rule may take the generated reliability information into account for a next decoding iteration and may be applied to switch from a hard decision decoding to a soft decision decoding. In an embodiment that implements a layer-based or a column-based decoding, the generated reliability information may be used in a next layer (or a few next layers) or a next column (or a few next columns) of the decoding process according to the first switching rule. In some embodiments, a second switching rule may be applied to switch from the soft decision decoding back to the hard decision decoding.

Exemplary ECC decoders according to the present disclosure may be applied in non-volatile storage controllers and communication signal processors. In a non-volatile storage system that does not provide soft data information, an embodiment may use the self-generated soft data information to achieve better performance. In a non-volatile storage system that supports soft data information, an embodiment may reduce the overall decoding latency by avoiding re-read of a non-volatile storage.

Disclosed herein may include a method, comprising performing a hard decision decoding on a codeword, recording a number of flip(s) for each bit of the codeword, generating reliability information for each bit based on the number of flip(s) for each bit respectively, determining to switch to soft decision decoding according to a switching rule and performing a soft decision decoding on the codeword using the reliability information for each bit.

According to an embodiment, the switching rule may comprise a threshold number for a total number of flips for all bits of the codeword accumulated in a current decoding session.

According to an embodiment, the current decoding session may be an iteration, one or more layers, or one or more columns based on a configuration of the hard decision decoding.

According to an embodiment, the threshold number may be configured based on a shape and/or characteristic of a parity check matrix used for checking the codeword.

According to an embodiment, the threshold number may be configured based on simulation for the parity check matrix.

According to an embodiment, the switching rule may comprise a threshold number based on an instant syndrome value.

According to an embodiment, the method may further comprise switching to the hard decision decoding when the soft decision decoding does not decrease a syndrome value.

Disclosed herein may further include an apparatus, comprising a decoder core configured to perform decoding in a hard decision decoding mode and a soft decision decoding mode, a soft data generator coupled to the decoder core and configured to generate soft data based on hard decision decoding of a codeword, and a switch coupled to the decoder core and configured to switch the decoder core from the hard decision decoding mode to the soft decision decoding mode when the soft data generated by the soft data generator triggers a switching rule. The soft decision decoding mode may make use of reliability information generated as part of the soft data.

According to an embodiment, the switching rule may comprise a threshold number for a total number of flips for all bits of the codeword accumulated in a current decoding session.

According to an embodiment, the current decoding session may be an iteration, one or more layers, or one or more columns based on a configuration of the hard decision decoding.

According to an embodiment, the threshold number may be configured based on a shape and/or characteristic of a parity check matrix used for checking the codeword.

According to an embodiment, the threshold number may be configured based on simulation for the parity check matrix.

According to an embodiment, decoder core may be configured to generate an instant syndrome value for each decoding session and the switching rule comprises a threshold number for a difference between two consecutive instant syndrome values.

According to an embodiment, the switch may be further configured to switch the decoder core to the hard decision decoding mode when the soft decision decoding mode does not decrease a syndrome value.

Disclosed herein may also include a non-transitory machine-readable medium having information that when read by a hardware controller system, causes the hardware controller system to: perform a hard decision decoding on a codeword, record a number of flip(s) for each bit of the codeword, generate reliability information for each bit based on the number of flip(s) for each bit respectively, determine to switch to soft decision decoding according to a switching rule and perform a soft decision decoding on the codeword using the reliability information for each bit.

According to an embodiment, the switching rule may comprise a threshold number for a total number of flips for all bits of the codeword accumulated in a current decoding session.

According to an embodiment, the current decoding session may be an iteration, one or more layers or one or more columns based on a configuration of the hard decision decoding.

According to an embodiment, the threshold number may be configured based on a shape and/or characteristic of a parity check matrix used for checking the codeword and on simulation for the parity check matrix.

According to an embodiment, the switching rule may comprise a threshold number based on an instant syndrome value.

According to an embodiment, the information, when read by a hardware controller system, may further cause the hardware controller system to switch to the hard decision decoding when the soft decision decoding does not decrease a syndrome value.

DETAILED DESCRIPTION

Specific embodiments according to the present disclosure will now be described in detail with reference to the accompanying figures. Like elements in the various figures are denoted by like reference numerals for consistency.

The present disclosure provides apparatuses, systems and methods for decoding linear block codes, such as, but not limited to, rectangular parity, the Hamming code, and the low-density parity check (LDPC) code. A linear block code may be specified by a m by n parity check matrix H, where n is the number of bits in a codeword and m is the number of redundancy bits (e.g., parity bits). For an LDPC code, the matrix H may be a sparse matrix that has a low density of non-zero elements. An n-bit codeword $c=[c1, c2, c3, \ldots, cn]$ is a valid codeword when it satisfies the matrix equation of $Hc^T=0$, where $c^T$ is the transpose of c and the vector $\vec{s}=Hc^T$ may be referred to as the syndrome of c. Linear block codes may also be represented in graphical form by a Tanner graph. The Tanner graph corresponding to the m by n matrix H may consist of two sets of vertices: n vertices for the codeword bits (bit nodes), and m vertices for the parity-check equations (check nodes).

One or more embodiments according to the present disclosure provide an approach for linear block decoding that comprises performing a hard decision decoding on a codeword, recording a number of flips for each bit of the codeword, generating reliability information for each bit based on the number of flips for each bit respectively, determining to switch to soft decision decoding based on a switching rule and performing a soft decision decoding on the codeword.

Figure 1:
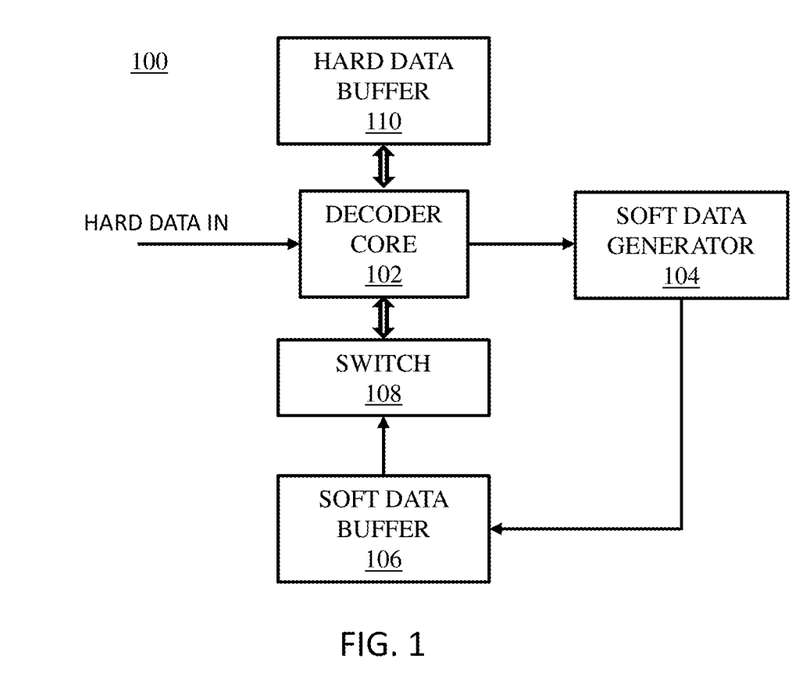
FIG. 1 schematically shows a linear block decoder in accordance with an embodiment of the present disclosure.

FIG. 1 schematically shows a linear block decoder 100, according to an embodiment. The linear block decoder 100 may comprise a decoder core 102, a soft data generator 104, a soft data buffer 106, a switch 108 and a hard data buffer 110. The decoder core 102 may be a decoder configured with two modes of operation: hard decision decoding and soft decision decoding. For example, the decoder core 102 may comprise decoder circuitry configured to perform hard decision decoding and decoder circuitry configured to perform soft decision decoding. In various embodiments, the decoder circuitry for hard decision decoding may be any suitable hard decision decoder that implements a hard decision algorithm, including but not limited to, a bit flipping algorithm or any other hard decision technique yet to be developed. And the decoder circuitry for soft decision decoding may be any suitable soft decision decoder that implements a soft decision algorithm, including but not limited to, any conventional soft decision algorithm based on belief propagation known in the industry (e.g., sum-product algorithm ("SPA"), min-sum algorithm, stochastic decoding algorithm, or their variations) or any other soft decision algorithms yet to be developed. For example, in one embodiment, the decoder core 102 may be a min-sum decoder, which can operate in a single-bit hard decision (HD) mode and a multiple-bit information soft decision (SD) mode.

The soft data generator 104 may comprise circuitry that may be configured to generate soft data, including, for example, accumulative flipping information and reliability information (e.g., soft log-likelihood ratio (LLR)) based on decoding operation of the decoder core 102. In one embodiment, for example, the decoder core 102 may receive hard data for a codeword from the "HARD DATA IN" signal line, and start decoding a codeword with hard decision decoding. The hard data may be received from a communication channel or retrieved from a storage device (e.g., a non-volatile storage such as a NAND storage device). During each iteration of a hard decision decoding operation, one or more bit symbols of the codeword may be flipped. The decoding information during an iteration (or during decoding a layer or a column) may be sent to the soft data generator 104. The decoding information may include, for example, which bit symbols have been flipped, how many times any bit symbol have been flipped, etc. The soft data generator 104 may generate reliability information for each bit symbol based on accumulative flipping information of each bit. For example, if one bit symbol is flipped many times after one or more iterations, then it is very likely this bit value may not be reliable. The generated reliability information may be sent to the soft data buffer 106 and temporarily stored therein. Although the soft data generator 104 may be shown in FIG. 1 as a component separate from the decoder core 102, in one embodiment, the soft data generator 104 may be implemented as part of the decoder core 102.

In some embodiments that implement an iterative decoding, the reliability information for each bit of the codeword may be updated after each iteration. In some iterative decoding embodiments, each iteration may be performed using a layer-based or column-based decoding. In these embodiments, the reliability information may be updated when each layer or column may be processed. In various embodiments, an iteration, a layer (or multiple layers when a group of layers decoded together) or a column (or multiple columns when a group of columns decoded together) may be used as a decoding session (or a decoding step) depending on the configuration of the decoder core 102. The accumulative flipping information for each bit of a codeword may be generated for all decoding sessions already performed until the point when such information is generated or updated.

The switch 108 may be configured with a switching rule. When conditions of the switching rule are satisfied, the switch 108 may let the decoder core 102 switch from hard decision decoding to soft decision decoding using the generated reliability information for each bit of the codeword. In one embodiment, the switch 108 may be implemented as a multiplexer. When the switching rule is not satisfied, the switch 108 will not let the reliability information stored in the soft data buffer 106 pass through. When the switching rule is satisfied, the switch 108 may let the reliability information pass through and be used by the decoder core 102.

Some exemplary switching rules may be based on a threshold number for a total number of flips. In one exemplary switching rule, a total number of flips of all code symbols in a codeword that have been processed during one decoding session may be counted as part of the soft data generated by the soft data generator 104. This piece of soft data may be passed to the switch 108 and compared to the threshold number. If the total number of flips is below the threshold number, which may mean the performance of the current hard decision decoding may not be satisfactory, the switching rule may be triggered to let the decoder core 102 switch from hard decision decoding to soft decision decoding for the next decoding session. It should be noted that in some embodiments (e.g., a layer-based decoding) one bit may be flipped multiple times during one counting period and each flip may be counted in the accumulative total number of flips. In some embodiments, the threshold number may be determined based on the shape and characteristics of the parity check matrix H and configured based on simulation using the parity check matrix H.

In various embodiments, syndrome may be computed and used to determine whether a decoding process is converging. For example, the decoder core 102 may be configured to compute syndrome while performing decoding work. During operation an initial syndrome may be computed when the decoding process starts. If the initial syndrome is zero, then the codeword is a valid codeword and no decoding process is needed. If the initial syndrome is not zero, the hard decision decoding may start. During or after each decoding session, an instant syndrome may be computed. If at any time the instant syndrome becomes zero, the codeword is decoded successfully and the decoding process may stop. In some embodiments, syndrome may also be used for a switching rule. In these embodiments, all elements of the vector syndrome $\vec{s}$ may be added together to generate a sum value, which may also be referred to as the syndrome value. In one embodiment, a switching rule may be based on a threshold number for the instant syndrome value. For example, the initial syndrome value may be an initial non-zero number and the instant syndrome values may decrease with each decoding session (e.g., indicating that the decoding is converging). In this embodiment, when the instant syndrome value reaches the threshold number, the switch 108 may trigger the decoder core 102 to switch from hard decision decoding to soft decision decoding.

In some embodiments, a switching rule may be based on the differences between instant syndrome values. In one embodiment, one exemplary switching rule may be based on a threshold number for the difference between two consecutive instant syndrome values. If the syndrome value does not decrease by at least the threshold number between the two consecutive decoding sessions the switch 108 may trigger the decoder core 102 to switch from hard decision decoding to soft decision decoding. For example, a threshold number may be configured as N and if a current syndrome value compared to an immediate preceding syndrome value does not decrease by N, the switch 108 may determine that the switching rule is satisfied and let the decoder core 102 switch from hard decision decoding to soft decision decoding for the next decoding session. The threshold number N may an integer, such as, 20, 30, 50 etc., which may be determined based on simulation according to the shape and characteristics of the parity check matrix. Similar to the switching rules based on total number of flips, in some embodiments, the threshold number for switch rules based on instant syndrome values may also be determined based on the shape and characteristics of the parity check matrix H and configured based on simulation using the parity check matrix H.

In some embodiments, the switch 108 may be further configured with another switching rule to switch from soft decision decoding to hard decision decoding. In one embodiment, the switching rule for switching to hard decision decoding may be based on syndrome. For example, if the instant syndrome values generated in the soft decision decoding do not decrease in successive decoding sessions (e.g., which may indicate the soft decision decoding does not converge), the switch 108 may let the decoder core 102 switch back to hard decision decoding. In an embodiment that the switch 108 may let the decoder core 102 switch from soft decision decoding to hard decision decoding, the decoder core 102 may be switched to soft decision decoding again when the hard decision decoding triggers the switching rule to switch to soft decision decoding.

In various embodiments, the decoding process may end when the instant syndrome reaches zero before a maximum number of iteration has been reached or when the maximum number of iteration has reached.

The hard data buffer 110 may be configured to store bit symbol values of hard decision decoding result after each decoding session. The stored bit values may be fed back to the decoder core 102 for the next decoding session, which may be a hard decision decoding session or a soft decision decoding session.

Figure 2A:
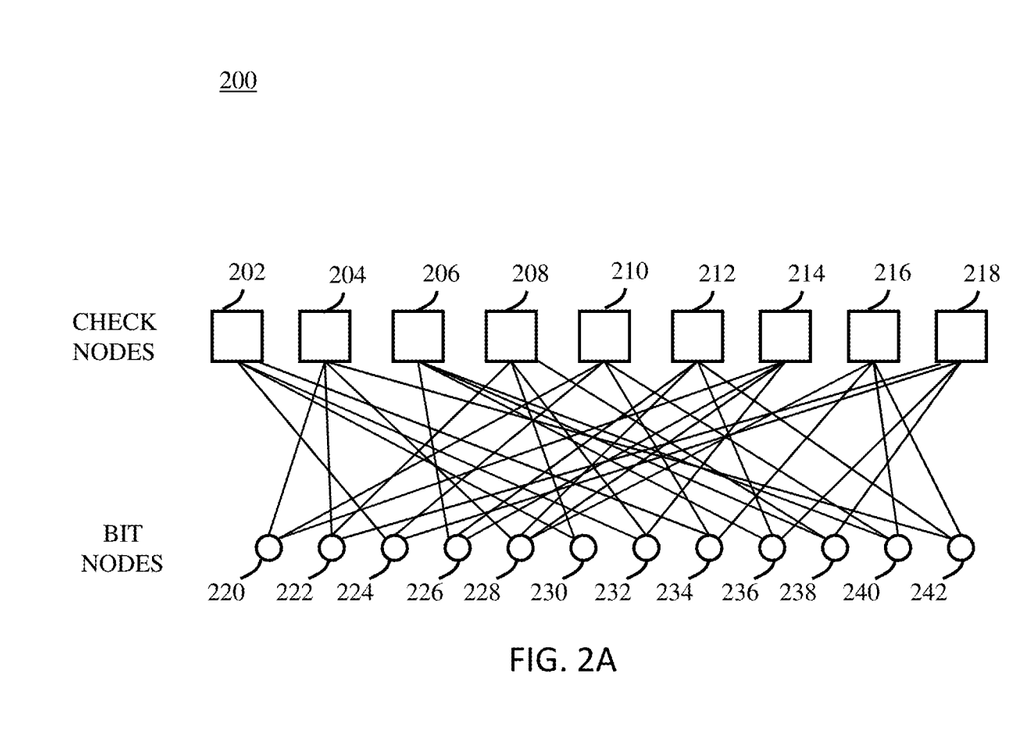
FIG. 2A is a graphical illustration of a Tanner graph for a codeword, in accordance with an embodiment of the present disclosure.

FIG. 2A is a graphical illustration of a Tanner graph 200 for a codeword, in accordance with an embodiment of the present disclosure. The Tanner graph 200 may be a bipartite graph that illustrates the parity check constraints for a block code such as a Hamming code or an LDPC code. The parity check constraints may be specified in a parity check matrix HE. For an LDPC code, the parity check matrix HE may be a low-density, sparse m by n matrix, in which m may be the number of rows (e.g., number of check nodes) and n may be the number of symbols in a codeword (e.g., number of bit nodes). The parity check matrix HE is not necessarily unique, and may be chosen by any known techniques or any techniques to be developed in the future.

Each row of the parity check matrix HE may correspond to one of the check nodes and each column may correspond to one of the bit nodes. In a binary code, the elements of the parity check matrix are 0 or 1, but for a non-binary LDPC code, the elements of the parity check matrix may have non-binary values. Each row of the parity check matrix may form the coefficients of a parity check equation. For example, for the nodes pictured in FIG. 2A, the parity check matrix HE may be as follows:

$$\begin{matrix} 0 & 0 & 1 & 0 & 0 & 1 & 1 & 1 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 0 & 1 & 1 & 1 & 0 \\ 0 & 1 & 0 & 0 & 0 & 1 & 1 & 0 & 0 & 1 & 0 & 0 \\ 1 & 0 & 1 & 0 & 0 & 0 & 0 & 1 & 0 & 0 & 1 & 0 \\ 0 & 0 & 0 & 1 & 1 & 0 & 0 & 0 & 1 & 0 & 0 & 1 \\ 1 & 0 & 0 & 1 & 1 & 0 & 1 & 0 & 0 & 0 & 0 & 0 \\ 0 & 0 & 0 & 0 & 0 & 1 & 0 & 1 & 0 & 0 & 1 & 1 \\ 0 & 1 & 1 & 0 & 0 & 0 & 0 & 0 & 1 & 1 & 0 & 0 \end{matrix}$$

There are two types of nodes shown in a Tanner graph. As shown in FIG. 2A, the check nodes 202, 204, 206, 208, 210, 212, 214, 216 and 218 may be denoted by squares and may represent parity check equations that a valid codeword or successfully decoded codeword must satisfy. The bit nodes 220, 222, 224, 226, 228, 230, 232, 234, 236, 238, 240 and 242 may be denoted as circles and may represent symbols (i.e., bits for a binary code) in a codeword, for example, the bit nodes 220, 222, 224, 226, 228, 230, 232, 234, 236, 238, 240 and 242 may represent $c_1$, $c_2$, $c_3$, $c_4$, $c_5$, $c_6$, $c_7$, $c_8$, $c_9$, $c_{10}$, $c_{11}$ and $c_{12}$ in a codeword $c=[c_1, c_2, c_3, c_4, c_5, c_6, c_7, c_8, c_9, c_{10}, c_{11}, c_{12}]$ respectively.

The connections between the check nodes and the bit nodes may represent parity check constraints. For example, the check node 202 may represent the first row of parity check equation specified in the parity check matrix HE shown above, which has non-zero values in columns 3, 6, 7 and 8. The symbols $c_3$, $c_6$, $c_7$ and $c_8$ in a codeword may correspond to these non-zero positions in the first row of the parity check matrix HE and the first row of parity check equation may be represented by the mathematic equation: $c_3 \oplus c_6 \oplus c_7 \oplus c_8 = 0$, where $\oplus$ is modulo-2 addition for binary codewords. Because the bit nodes 224, 230, 232 and 234 correspond to the symbols $c_3$, $c_6$, $c_7$ and $c_8$, the check node 202 may be connected to these bit nodes. That is, the check node 202 may be considered to "check" the bit nodes 224, 230, 232 and 234. Similarly, the check node 204 may represent the second row of parity check equations specified in the parity check matrix HE shown above, which has non-zero values in columns 1, 2, 5 and 12, and the second row of parity check equation may be represented by the mathematic equation: $c_1 \oplus c_2 \oplus c_5 \oplus c_{12} = 0$, where $\oplus$ is modulo-2 addition for binary codewords. Because the bit nodes 220, 222, 228 and 242 may correspond to the symbols $c_1$, $c_2$, $c_5$ and $c_{12}$, the check node 204 may be connected to these bit nodes. The check node 204 may be considered to "check" the bit nodes 220, 222, 228 and 242. The other check nodes may be connected to the bit nodes according to respective parity check constraints. It should be noted that because each row has four non-zero positions, each check node may be connected to four bit nodes.

From the bit nodes perspective, each column in the parity check matrix HE shown above may be non-zero in three rows. That is, each symbol in a codeword may be "checked" by three parity check equations. Accordingly, each bit node may be connected to three check nodes. For example, the first symbol in a codeword may be checked in the second, fifth and seventh parity check equations (the second, fifth and seventh rows of the matrix HE). The bit node 220, which may represent the first symbol in a codeword, may be connected to the check nodes 204, 210 and 214. The bit node 222, which may represent the second symbol in a codeword, may be connected to the check nodes 204, 208 and 218. The other bit nodes may be connected to the check nodes according to respective parity check constraints. The overall connections from the bit nodes' perspective are the same as that from the check nodes' perspective.

Figure 2B:
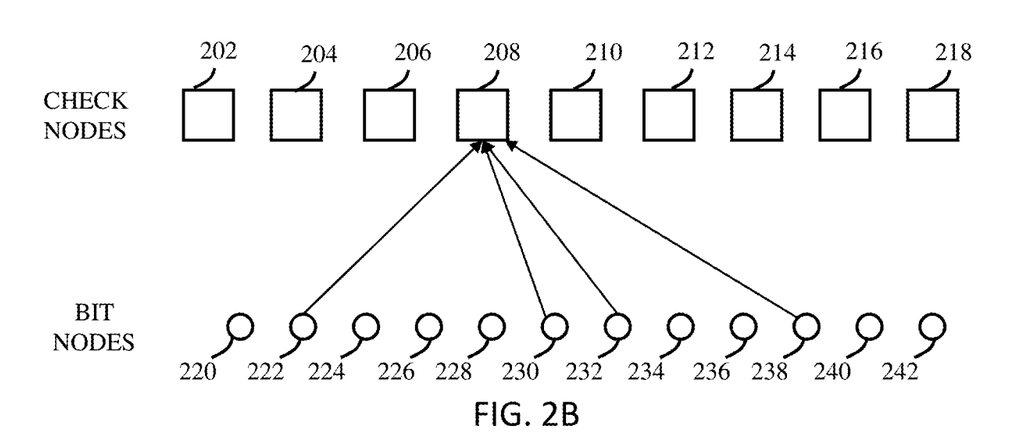
FIGS. 2B, and 2C are graphical illustrations of information passing in a Tanner graph for a codeword, in accordance with an embodiment of the present disclosure.
Figure 2C:
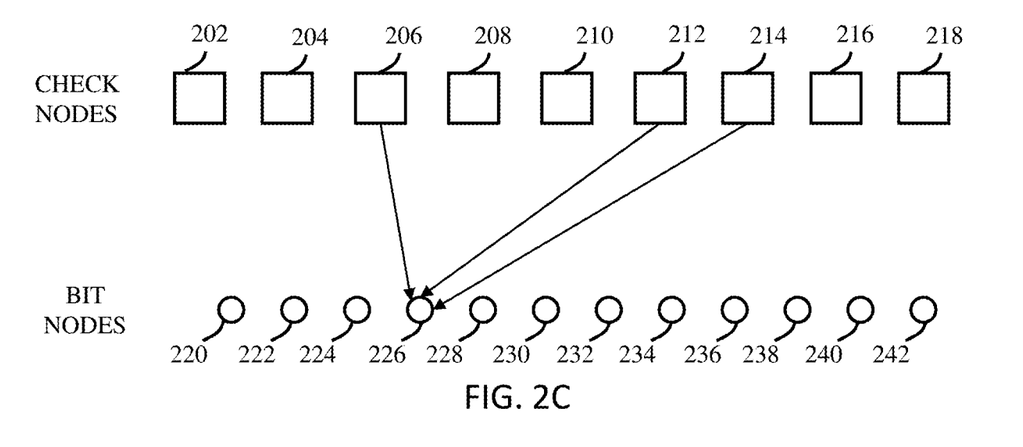

FIGS. 2B, and 2C are graphical illustrations of information passing in the Tanner graph 200 for a codeword, in accordance with an embodiment of the present disclosure. The Tanner graph 200 may be used for an iterative decoding of a codeword in both hard decision and soft decision decoding modes. As shown in FIG. 2A, the check node 208 may be connected to the bit nodes 222, 230, 232 and 238. That is, the check node 208 may "check" the bit nodes 222, 230, 232 and 238. For illustration, the arrows in FIG. 2B indicate that information may flow from the bit nodes 222, 230, 232 and 238 to the check node 208. The check node 208 may perform an operation to "check" the bit nodes 222, 230, 232 and 238 based on the information passed from these bit nodes. This may be referred to as a symbol-to-check step in an iterative decoding operation. The check nodes may perform the "check" operation according to the decoding algorithm implemented by a decoder (e.g., a hard decision algorithm, or a soft decision decoding algorithm).

Moreover, the Tanner graph 200 in FIG. 2A illustrates that the bit node 226 may be connected to the check nodes 206, 212 and 214. That is, the bit node 226 may be "checked" by the check nodes 206, 212 and 214. The arrows in FIG. 2C indicate that information may flow from the check nodes 206, 212 and 214 to the bit node 226. The bit node 226 may perform an operation to update its information (e.g., symbol value, or both symbol value and reliability of the symbol value depending on whether it is a hard decision decoding, or a soft decision decoding) based on the information from the check nodes 206, 212 and 214. This may be referred to as a check-to-symbol step in an iterative decoding operation.

It should be noted that binary codes may be used as examples herein. But non-binary codes, for example, linear block codes based on a Galois Field ($2^f$) with f being an integer larger than one may be used in one or more embodiments according to the present disclosure.

Figure 3:
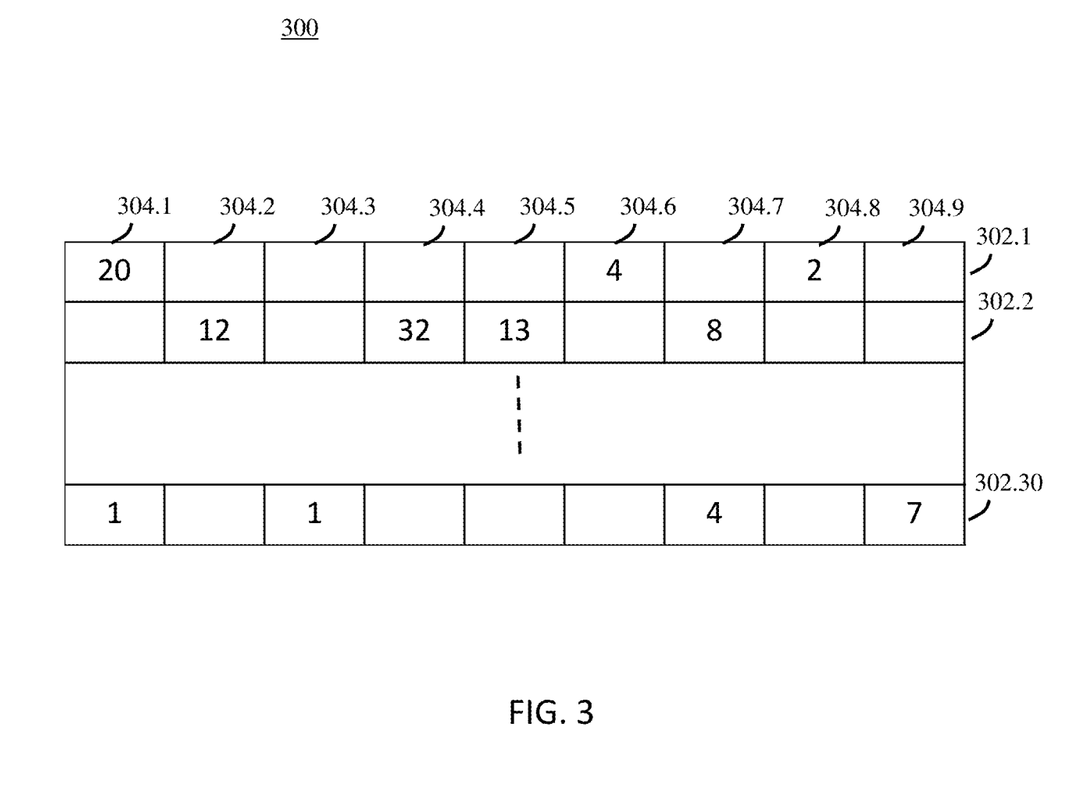
FIG. 3 schematically shows a parity check matrix for an LDPC code in accordance with an embodiment of the present disclosure.

Some LDPC codes suitable for use by a linear block decoder 100 may include quasi-cyclic (QC) LDPC codes in which the parity check matrix comprises a plurality of square submatrices that are either zero, unity, or cyclically-shifted unity matrices, although the scope of the invention is not limited in this respect. FIG. 3 schematically shows a parity check matrix 300 for an QC LDPC code in accordance with an embodiment of the present disclosure. The parity check matrix 300 may comprise 9×30 squares with 9 columns and 30 rows of square submatrices. For illustration purpose, only the rows 302.1, 302.2 and 302.30 of the 30 rows of square submatrices, and columns 304.1, 304.2,

304.3, 304.4, 304.5, 304.6, 304.7, 304.8 and 304.9 of the square submatrices may be labeled. Each square submatrix may be a Z×Z square submatrix with Z being an integer number. In the embodiment shown in FIG. 3 each square submatrix of the parity check matrix 300 may comprise 32 rows and 32 columns of elements but the number Z can be another number that may be a factor of the codeword length.

A square submatrix may be a zero square, meaning all elements in the square submatrix is zero, and such a square submatrix may be shown as an empty square submatrix. For example, counting from the left, the second, third, fourth, fifth, seventh and ninth square submatrices of the row 302.1 may be zero square submatrices.

Or a square may be a non-zero square, which may be referred to as a circulant matrix. A circulant matrix may be a unity square submatrix or a cyclically-shifted square submatrix. A unity square submatrix may be a square matrix that every diagonal element from the top left corner to the bottom right corner may be one and all other elements may be zero. In one embodiment, a unity square submatrix may be denoted by a number zero ("0"). A cyclically-shifted unity square submatrix may be a unity square matrix with each element cyclically shifted a fixed number of times. A cyclically shift may mean each element in a row being moved to an adjacent element's position in a shifting direction with the end element of the row being moved to the beginning element's position. In one embodiment, a cyclically-shifted unity square submatrix may be obtained by cyclically shifting all of elements of a unity square submatrix to the right a fixed number of times and denoted by the fixed number of cyclic right shifts. For example, the square submatrix located at column 304.1 and row 302.1 may be denoted by the number 20 because it may be a unity square submatrix right cyclically-shifted 20 times.

It should be noted that the parity check matrix HE corresponding to the Tanner graph in FIG. 2A may correspond to a regular LDPC code, in which every code digit may be contained in the same number of equations and each equation may contain the same number of code symbols. For example, each row of the parity check matrix HE, which may correspond to a parity check equation, may contain four code symbols marked by ones, and each code symbol may be contained in three parity check equations. In contrast, the parity check matrix 300 may correspond to an irregular LDPC code that may have a variable number of 1's in the rows and in the columns. For example, the row 302.1 may contain three non-zero square submatrices, meaning three code symbols may be contained in each parity check equation in the row 302.1. In the example shown in FIG. 3, there may be 32 rows of elements in each square submatrices of the row 302.1, and thus the 302.1 may correspond to 32 parity check equations each may "check" three code symbols. The row 302.2 may contain four non-zero square submatrices and correspond to 32 parity check equations each may "check" four code symbols. These examples show that both regular and irregular LDPC codes may be implemented in embodiments according to the present disclosure.

In embodiments that implement layer-based or column-based decoding, a decoding session (e.g., a decoding step) may be performed on one or more layers (e.g., one or more rows of square matrices of the parity check matrix), one or more columns (e.g., one or more columns of square matrices of the parity check matrix), or a combination of one or more layers and one or more columns. For example, in one embodiment, in each decoding session, one row of square matrices may be processed; in another embodiment, in each decoding session, two or more rows of square matrices may be processed. In yet another embodiment, in each decoding session, one column of square matrices may be processed; and in yet a further embodiment, in each decoding session, two or more columns of square matrices may be processed. In some embodiments, layer-based and column-based decoding may be combined. For example, a decoding session may include blocks of square matrices (e.g., intersections of K columns and F rows such that F times K square matrices to be processed in one decoding session, with K and F being integers equal or larger than one respectively).

Figure 4:
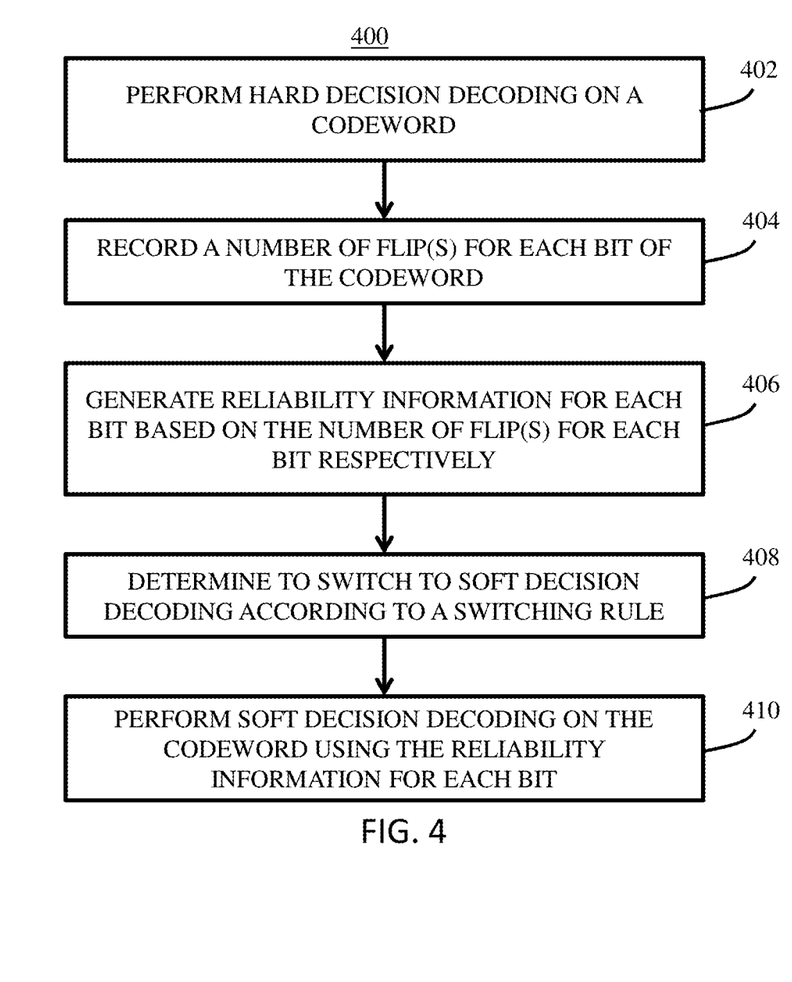
FIG. 4 is a flow diagram of a process for decoding a codeword in accordance with an embodiment of the present disclosure.

FIG. 4 is a flow chart for a process 400 to decode a linear block codeword using soft data generated from hard decision decoding according to an embodiment. In block 402, a hard decision decoding may be performed on a codeword. For example, the decoder core 102 may receive a codeword from on the hard data in signal line and perform a hard decision decoding operation on the codeword. In block 404, a number of flip(s) for each bit of the codeword may be recorded. For example, at the end of a current decoding session or decoding step, the flipping information for each bit of the codeword may be collected at the decoder core 102 and transmitted to the soft data generator 104. In block 406, reliability information for reach bit may be generated based on the number of flip(s) for each bit. The soft data generator 104 may accumulate the flip(s) for each bit of the codeword and use this information to determine whether the bit value for a bit may be reliable. For example, during the decoding process, the decoder 100 may have information of how many times each bit has been flipped. If one bit location is flipped many times, then it is very likely the bit value is not reliable.

In block 408, whether switching to soft decision decoding may be determined according to a switch rule. As described herein, various embodiments of switching rules may include threshold numbers for number of flips during one decoding session, syndrome values, or combinations of these conditions. In block 410, a soft decision decoding may be performed on the codeword using the reliability information for each bit.

Embodiments of the processes disclosed herein (including the process 400) may be implemented using software (e.g., executable by a computer processor (e.g., a central processing unit (CPU), a graphics processing unit (GPU), or both)), hardware (e.g., a field-programmable gate array (FPGA) or an application-specific IC (ASIC), firmware, or any suitable combination of the three. In one embodiment, for example, the components of the linear block decoder 100 may be implemented in hardware circuitry and the processes may be carried on in hardware.

In another embodiment, for example, the components of the linear block decoder 100 and any of the disclosed methods and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or non-volatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media). Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

Figure 5:
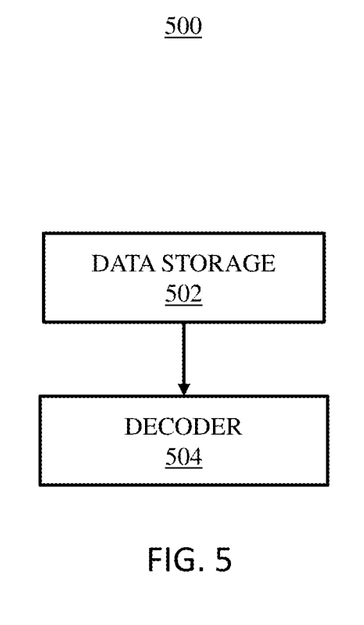
FIG. 5 schematically shows a storage system with error correction in accordance with an embodiment of the present disclosure.

FIG. 5 schematically shows a system 500 comprising the linear block decoder 100 described herein. The system 500 may be a storage system, such as, but not limited to a memory, or a hard drive system. The system 500 may comprise a data storage 502 and a decoder 504. The data storage 502 may be, for example, a memory or a hard drive. The decoder 504 may be an embodiment of the linear block decoder 100 shown in FIG. 1. Data read from the data storage 502 may be corrupt and the decoder 504 may decode the corrupt data and recover the correct data information.

Figure 6:
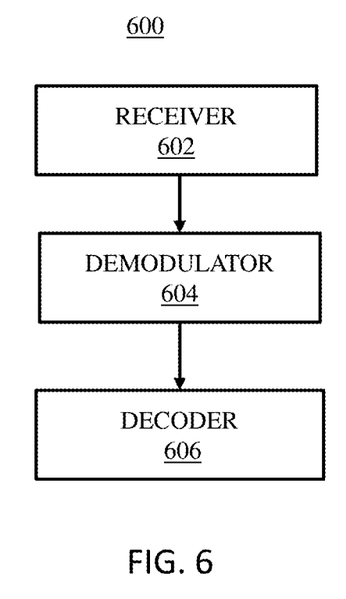
FIG. 6 schematically shows a communication system with error correction in accordance with an embodiment of the present disclosure.

FIG. 6 schematically shows another system 600 comprising the linear block decoder 100 described herein. The system 600 may be a communication system, such as, but not limited to a wired or wireless communication system. The system 600 may comprise a receiver 602, a demodulator 604 and a decoder 606. The receiver 602 may be, for example, an antenna for a wireless communication or a receiver in a wired communication. The demodulator 604 may be configured to demodulate the signals received by the receiver 602 and generate digital signals. The decoder 606 may be an embodiment of the linear block decoder 100 shown in FIG. 1. Data received by the receiver 602 may be corrupt and the decoder 606 may decode the corrupt data and recover the correct data information.

It should be noted that, in several examples and embodiments, LDPC may be used as an example for linear block codes. Embodiments according to the present disclosure, however, may be implemented for other types of linear block codes, such as, but not limited to, rectangular parity and Hamming code. Moreover, the word "code" such as used in the "linear block code," "LDPC code" or "Hamming code," may refer to the type of code in general. And the word "codeword" may refer to a unit block of data encoded with a linear block code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
performing a hard decision decoding on a codeword;
counting a number of times each bit of the codeword flipped during the hard decision decoding;
generating reliability information for each bit based on the number of times each bit flipped respectively;
determining to switch to soft decision decoding according to a switching rule; and
performing a soft decision decoding on the codeword using the reliability information for each bit.

2. The method of claim 1, wherein the switching rule comprises a threshold number for a total number of flips for all bits of the codeword accumulated in a current decoding session.

3. The method of claim 2, wherein the current decoding session is an iteration, one or more layers, or one or more columns based on a configuration of the hard decision decoding.

4. The method of claim 2, wherein the threshold number is configured based on a shape and/or characteristic of a parity check matrix used for checking the codeword.

5. The method of claim 4, wherein the threshold number is configured based on simulation for the parity check matrix.

6. The method of claim 1, wherein the switching rule comprises a threshold number based on an instant syndrome value.

7. The method of claim 1, further comprising switching to the hard decision decoding when the soft decision decoding does not decrease a syndrome value.

8. An apparatus, comprising:
a decoder core configured to perform decoding in a hard decision decoding mode and a soft decision decoding mode;
a soft data generator coupled to the decoder core and configured to generate soft data based on how many times each bit flipped during the hard decision decoding of a codeword; and
a switch coupled to the decoder core and configured to switch the decoder core from the hard decision decoding mode to the soft decision decoding mode when the soft data generated by the soft data generator triggers a switching rule, wherein the soft decision decoding mode makes use of reliability information generated as part of the soft data.

9. The apparatus of claim 8, wherein the switching rule comprises a threshold number for a total number of flips for all bits of the codeword accumulated in a current decoding session.

10. The apparatus of claim 9, wherein the current decoding session is an iteration, one or more layers, or one or more columns based on a configuration of the hard decision decoding.

11. The apparatus of claim 9, wherein the threshold number is configured based on a shape and/or characteristic of a parity check matrix used for checking the codeword.

12. The apparatus of claim 11, wherein the threshold number is configured based on simulation for the parity check matrix.

13. The apparatus of claim 8, wherein the decoder core is configured to perform decoding in the hard decision decoding mode in a plurality of decoding sessions and generate an instant syndrome value for each decoding session and the switching rule comprises a threshold number for a difference between two consecutive instant syndrome values.

14. The apparatus of claim 8, wherein the switch is further configured to switch the decoder core to the hard decision decoding mode when the soft decision decoding mode does not decrease a syndrome value.

15. A non-transitory machine-readable medium having information, wherein the information, when read by a hardware controller system, causes the hardware controller system to:
perform a hard decision decoding on a codeword;
count a number of times each bit of the codeword flipped during the hard decision decoding;
generate reliability information for each bit based on the number of times each bit flipped respectively
determine to switch to soft decision decoding according to a switching rule; and perform a soft decision decoding on the codeword using the reliability information for each bit.

16. The non-transitory machine-readable medium of claim 15, wherein the switching rule comprises a threshold number for a total number of flips for all bits of the codeword accumulated in a current decoding session.

17. The non-transitory machine-readable medium of claim 16, wherein the current decoding session is an iteration, one or more layers or one or more columns based on a configuration of the hard decision decoding.

18. The non-transitory machine-readable medium of claim 16, wherein the threshold number is configured based on a shape and/or characteristic of a parity check matrix used for checking the codeword and on simulation for the parity check matrix.

19. The non-transitory machine-readable medium of claim 15, wherein the switching rule comprises a threshold number based on an instant syndrome value.

20. The non-transitory machine-readable medium of claim 15, wherein the information, when read by a hardware controller system, causes the hardware controller system further to switch to the hard decision decoding when the soft decision decoding does not decrease a syndrome value.

* * * * *